United States Patent
Kitamura et al.

(10) Patent No.: US 8,519,751 B2
(45) Date of Patent: Aug. 27, 2013

(54) GATE DRIVE CIRCUIT

(75) Inventors: Tatsuya Kitamura, Tokyo (JP); Hiroshi Nakatake, Tokyo (JP); Yasushi Nakayama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 38 days.

(21) Appl. No.: 13/390,721

(22) PCT Filed: Sep. 2, 2010

(86) PCT No.: PCT/JP2010/005399
§ 371 (c)(1),
(2), (4) Date: Feb. 16, 2012

(87) PCT Pub. No.: WO2011/033733
PCT Pub. Date: Mar. 24, 2011

(65) Prior Publication Data
US 2012/0153998 A1    Jun. 21, 2012

(30) Foreign Application Priority Data
Sep. 15, 2009  (JP) ................... 2009-213124

(51) Int. Cl.
*H03K 3/00* (2006.01)
(52) U.S. Cl.
USPC ........... 327/109; 327/383; 327/391; 327/427; 327/437
(58) Field of Classification Search
USPC ............. 327/109, 112, 374, 376–377, 383, 327/389, 391, 427, 432–437
See application file for complete search history.

(56) References Cited

U.S. PATENT DOCUMENTS

| | | | | |
|---|---|---|---|---|
| 5,055,721 A * | 10/1991 | Majumdar et al. | ............ | 327/434 |
| 5,808,504 A | 9/1998 | Chikai et al. | | |
| 6,380,796 B2 * | 4/2002 | Sakai et al. | ................... | 327/434 |
| 6,687,106 B1 | 2/2004 | Tanaka et al. | | |
| 2012/0013371 A1 * | 1/2012 | Nakatake et al. | ............ | 327/109 |

FOREIGN PATENT DOCUMENTS

| | | |
|---|---|---|
| JP | 2 7714 | 1/1990 |
| JP | 4 119722 | 4/1992 |
| JP | 6 318678 | 11/1994 |
| JP | 7 245557 | 9/1995 |
| JP | 7 264031 | 10/1995 |
| JP | 7-264031 A | 10/1995 |

OTHER PUBLICATIONS

Office Action issued Dec. 5, 2012, in German Patent Application No. 11 2010 003 761.2 with English translation.
International Search Report issued on Oct. 12, 2010 in PCT/JP10/005399 filed on Sep. 2, 2010.

* cited by examiner

*Primary Examiner* — An Luu
(74) *Attorney, Agent, or Firm* — Oblon, Spivak, McClelland, Maier & Neustadt, L.L.P.

(57) ABSTRACT

A gate drive circuit capable of turning on a semiconductor switching element at high speed, which includes: a buffer circuit including a turn-on-drive switching element and a turn-off-drive switching element that are complementarily turned on and off, for driving the semiconductor switching element; a first DC voltage supply including a positive electrode connected to the source or emitter of the turn-on-drive switching element and a negative electrode connected to a reference potential; and a second DC voltage supply including a positive electrode connected to the source or emitter of the turn-off-drive switching element and a negative electrode connected to the reference potential.

12 Claims, 6 Drawing Sheets

GATE DRIVE CIRCUIT

TECHNICAL FIELD

The present invention relates to gate drive circuits for driving semiconductor switching elements, and in particular to a gate drive circuit capable of switching a semiconductor switching element at high speed.

BACKGROUND ART

In a conventional gate drive circuit, a buffer circuit including transistors and/or MOSFETs connected in series has been generally used as a gate drive circuit for driving a MOSFET (metal-oxide-semiconductor field-effect transistor) that is a semiconductor switching element. This circuit applies a negative bias voltage to a reference potential of the buffer, whereby the gate voltage can be made negative when the MOSFET is off; therefore, the semiconductor switching element can be prevented from malfunctioning in switching (refer to Patent Document 1, for example).
Prior Art Document
Patent Document
Patent Document 1: Japanese Laid-Open Patent Publication No. H7-245557 (FIG. 1, Page 3)

DISCLOSURE OF THE INVENTION

Problem to be Solved by the Invention

A semiconductor switching element causes conduction loss during a transient period of switching. The conduction loss has been increasing attributed to an increase in the capacity of the semiconductor switching element, which however has been conventionally reduced by enhancing switching speed of the semiconductor switching element so as to shorten the transient period. In recent years, semiconductor switching elements made of wide-bandgap semiconductor have been put into practical use, which has enabled even higher speed switching, and further reduction in the conduction loss is expected. However, the driving capacity of the drive circuit for the MOSFET becomes insufficient, causing a problem in that performance of the semiconductor switching element cannot be fully brought out. Moreover, in order to reduce the conduction loss attributed to the increase in the capacity of the semiconductor switching element, the on-resistance of the semiconductor switching element has been decreased, so as to reduce the conduction loss. In general, however, the on-resistance of the semiconductor switching element is in a tradeoff relation to the switching threshold voltage of the switching element; the smaller the on-resistance is made, the lower the threshold voltage of the semiconductor switching element becomes, so that the element becomes easy to be affected by noise, thereby causing a problem in that malfunctioning in switching might be more likely to occur.

The present invention has been made to resolve the foregoing problems, and aims at providing a gate driver circuit capable of driving the semiconductor switching element at high speed.

Means for Solving the Problem

A gate drive circuit according to the present invention comprises: a buffer circuit including a turn-on-drive switching element and a turn-off-drive switching element that are complementarily turned on and off, for driving a semiconductor switching element; a first DC voltage supply the positive electrode of which is connected to the source or emitter of the turn-on-drive switching element and the negative electrode of which is connected to a reference potential of the gate drive circuit; and a second DC voltage supply the positive electrode of which is connected to the source or emitter of the turn-off-drive switching element and the negative electrode of which is connected to the reference potential.

Moreover, another gate drive circuit according to the present invention comprises: a buffer circuit including a turn-on-drive switching element and a turn-off-drive switching element that are complementarily turned on and off, for driving a semiconductor switching element; a DC voltage supply the positive electrode of which is connected to the source or emitter of the turn-on-drive switching element and the negative electrode of which is connected to a reference potential of the gate driver circuit; and a drive logic for outputting a voltage pulse to the gate of each of the turn-on-drive switching element and the turn-off-drive switching element; wherein the drive logic takes at least either one of controls of outputting the voltage pulse with a high potential side of which raised higher than the source potential of the turn-on-drive switching element and outputting the voltage pulse with a low potential side of which lowered lower than the source potential of the turn-off-drive switching element.

Advantage of the Invention

The present invention comprises: a buffer circuit including a turn-on-drive switching element and a turn-off-drive switching element that are complementarily turned on and off, for driving a semiconductor switching element; a first DC voltage supply the positive electrode of which is connected to the source or emitter of the turn-on-drive switching element and the negative electrode of which is connected to a reference potential of the gate drive circuit; and a second DC voltage supply the positive electrode of which is connected to the source or emitter of the turn-off-drive switching element and the negative electrode of which is connected to the reference potential; therefore, the turn-off-drive switching element can be turned off at high speed, so that the semiconductor switching element can be turned on at high speed.

BEST MODE FOR CARRYING OUT THE INVENTION

Embodiment 1

Figure 1:
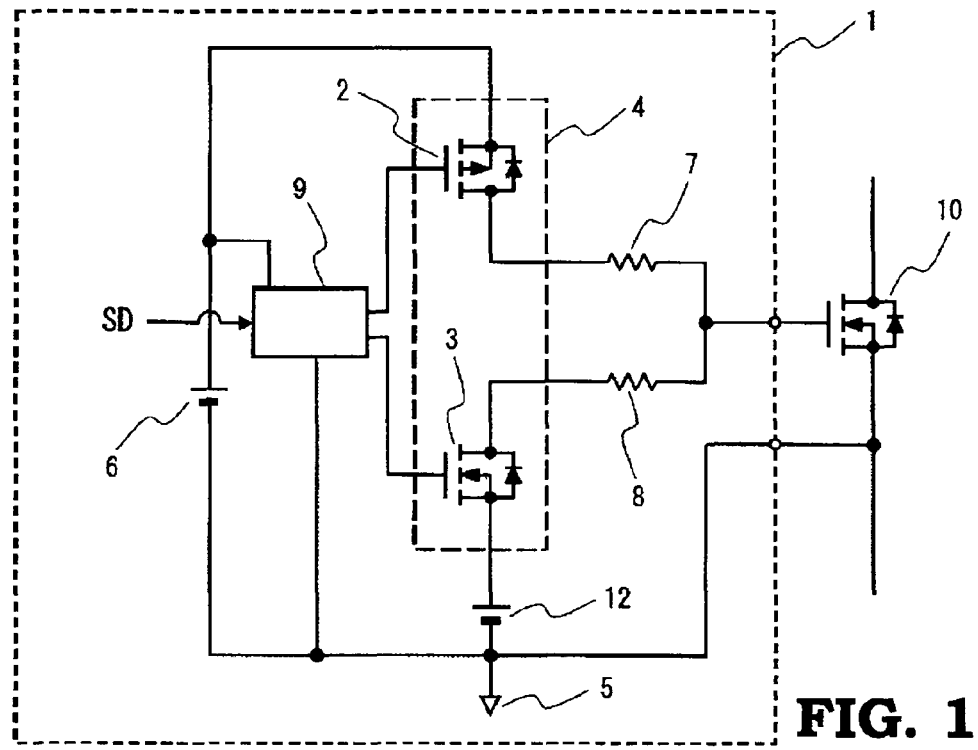
FIG. 1 is a schematic configurational diagram of a gate drive circuit according to Embodiment 1 of the present invention.

FIG. 1 is a schematic configurational diagram of a gate drive circuit according to Embodiment 1 of the present invention. The gate drive circuit 1 drives a MOSFET 10 that is a semiconductor switching element. In FIG. 1, the gate drive circuit 1 includes a buffer 4 that is a buffer circuit for driving the MOSFET 10, a first DC voltage supply 6 and a second DC voltage supply 12.

The buffer 4 includes a P-channel MOSFET 2, which is a turn-on-drive switching element, and an N-channel MOSFET 3, which is a turn-off-drive switching element, that are totem-pole-connected with each other and complementarily turned on and off. The MOSFET 10 is turned on by the P-channel MOSFET 2, which is the turn-on-drive switching element, being turned on, and is turned off by the N-channel MOSFET 3, which is the turn-off-drive switching element, being turned on. The positive electrode of the first DC voltage supply 6 is connected to the source of the P-channel MOSFET 2 and the negative electrode thereof is connected to a reference potential (VS) 5 of the gate drive circuit 1. Moreover, the positive electrode of the second DC voltage supply 12 is connected to the source of the N-channel MOSFET 3 and the negative electrode thereof is connected to the reference potential 5 of the gate drive circuit 1. The second DC voltage supply 12 can raise the source potential of the N-channel MOSFET 3 higher than the reference potential 5.

Moreover, the gate drive circuit 1 includes a gate resister 7 for when the MOSFET 10 is in the on state, a gate resister 8 for when that is in the off state, and a drive logic 9 that takes in a drive signal (SD) and outputs a gate voltage to the respective gates of the P-channel MOSFET 2 and the N-channel MOSFET 3. The drive logic 9 is also connected to the positive electrode of the first DC voltage supply 6 and supplied with a DC voltage from the first DC voltage supply 6. Moreover, the drive logic 9 is also connected to the reference potential 5. In order to complementarily turn on and off the P-channel MOSFET 2 and the N-channel MOSFET 3, the gate voltage output from the drive logic 9 becomes a voltage pulse alternating between a high potential (for example, a DC voltage of Vout) and a low potential (for example, the reference potential). When the gate voltage becomes the high potential, the P-channel MOSFET 2 goes into the on state, so that the MOSFET 10 goes into the on state. When the gate voltage becomes the low potential, the N-channel MOSFET 3 goes into the on state, so that the MOSFET 10 goes into the off state.

Figure 2:
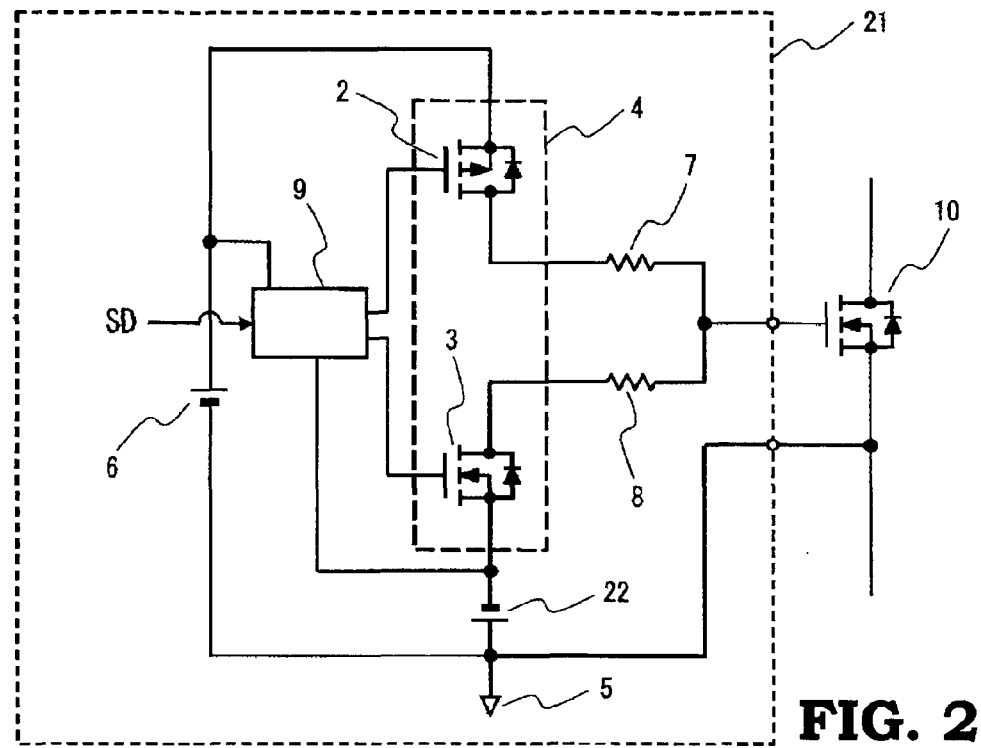
FIG. 2 is a schematic configurational diagram of a conventional gate drive circuit.

Prior to an explanation of Embodiment 1, a conventional general-use gate drive circuit will be explained in order to help better understand the present invention. FIG. 2 is a schematic configurational diagram showing an example of the conventional gate drive circuit. In the gate drive circuit 1 according to Embodiment 1, the positive electrode of the second DC voltage supply interposed between the N-channel MOSFET 3 and the reference potential 5 is connected to the source of the N-channel MOSFET 3. On the other hand, the negative electrode of a second DC voltage supply 22 interposed between the N-channel MOSFET 3 and the reference potential 5 is connected to the source of the N-channel MOSFET 3 in the conventional gate drive circuit 21, which is therefore different from Embodiment 1 in this respect. As to the configuration other than that, the gate drive circuit 1 according to Embodiment 1 is the same as the conventional gate drive circuit 21.

In the forgoing conventional gate drive circuit 21, when the MOSFET 10 subject to drive is in the off state, a voltage across the gate and source of the MOSFET 10 (hereinafter denoted by Vgs) is brought into a negatively biased state with respect to the reference potential 5 by the DC voltage supply 22. Therefore, the MOSFET 10 can be prevented from malfunctioning due to noise in switching. Here, note the operation of the buffer 4 when turning on the MOSFET 10. In order to turn on the MOSFET 10, the P-channel MOSFET 2 of the buffer 4 needs to be turned on after the N-channel MOSFET 3 has been turned off at first. In order to turn on the MOSFET 10 at high speed, it is preferable for the N-channel MOSFET 3 to be turned off as quickly as possible.

Figure 3:
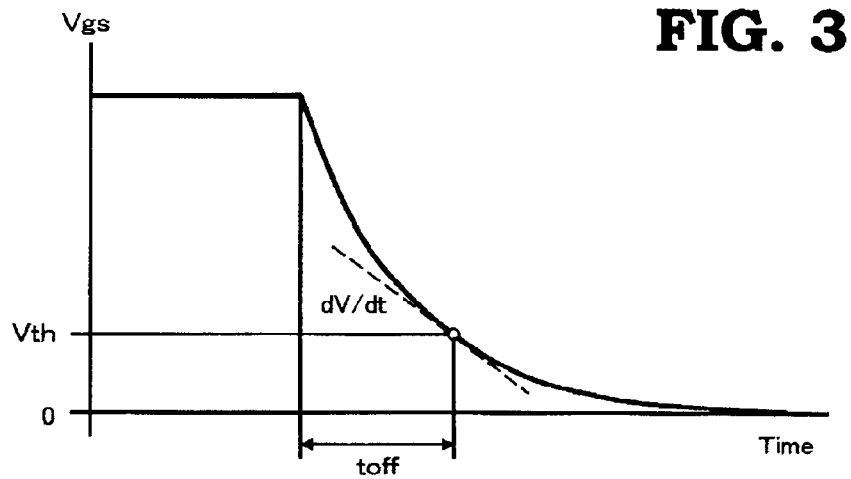
FIG. 3 is a diagram showing an example of a transient response waveform of a voltage across the gate and source of an N-channel MOSFET of the conventional gate drive circuit.
Figure 4:
FIG. 4 is a diagram showing an example of a typical relation between a drain current and a voltage across the gate and source of an N-channel MOSFET.

FIG. 3 shows an example of a transient response waveform of Vgs of the N-channel MOSFET 3 when the N-channel MOSFET 3 is turned off. In FIG. 3, the vertical axis is Vgs, which represents a potential difference applied across the gate and source of the N-channel MOSFET 3, with respect to the source potential. In the case of the gate drive circuit 21 shown in FIG. 2 here, the potential corresponding to Vgs=0 becomes a potential of the reference potential 5 minus a DC voltage of Vbuffer by the DC voltage supply 22. The N-channel MOSFET 3 turns off when Vgs becomes lower than a fixed threshold value (hereinafter denoted by Vth); however, the voltage variation rate (gradient) dV/dt of Vgs differs depending on a fall time (hereinafter denoted by toff) that is a transient time from when the N-channel MOSFET 3 is turned off to when it actually turns off. A typical relation between a drain current (hereinafter denoted by Id) of the N-channel MOSFET and Vgs is exemplified in FIG. 4. It is understood from the relation between Id and Vgs shown in FIG. 4 that a current variation rate of Id increases as Vgs increases. That is to say, the higher Vth is raised, the greater the current variation rate becomes; therefore Id can be interrupted more quickly, which will lead to shortening of toff of the N-channel MOSFET 3. Since toff is part of a rise time of the MOSFET 10 subject to drive, toff of the N-channel MOSFET 3 needs to be shortened in order to drive the MOSFET 10 at high speed.

The operation of the gate drive circuit according to this Embodiment will be explained next. In the gate drive circuit 1 according to this Embodiment, the second DC voltage supply 12 supplies a voltage (hereinafter denoted by Vnbuffer), whereby the source potential of the N-channel MOSFET 3 can be raised by Vnbuffer with respect to the reference potential 5. Moreover, since the source potential of the N-channel MOSFET 3 is raised by Vnbuffer, the high potential side of the gate voltage output from the drive logic 9 is set relatively higher by Vnbuffer, and a gate voltage of Vout+Vnbuffer is output. Thereby, even if the source potential of the N-channel MOSFET 3 is raised by the DC voltage supply 12, Vgs of the N-channel MOSFET 3 in the on operation is set to the same value. In addition, Vgs and Vnbuffer can be arbitrarily set in conformity with the specification of the N-channel MOSFET 3. For example, Vout can be set to 15 V and Vnbuffer to 5 V. Of course they are not limited to these voltages.

Figure 5:
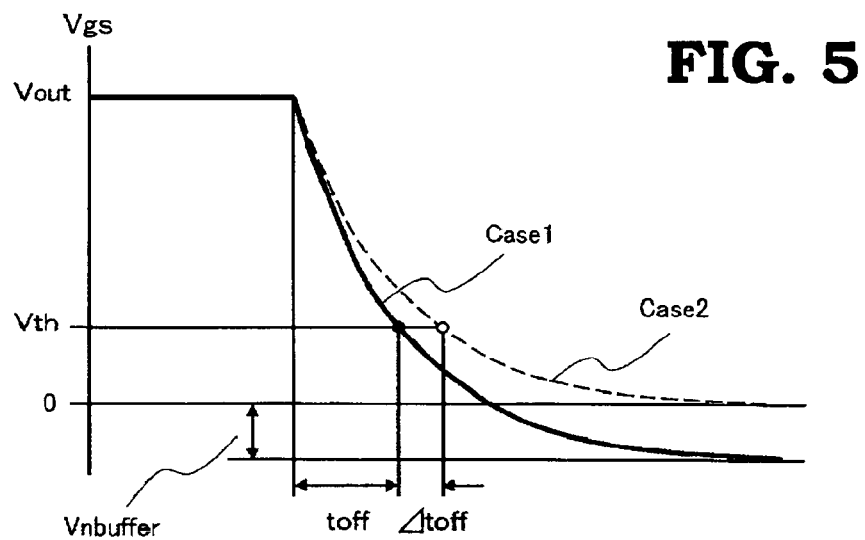
FIG. 5 is a diagram showing a transient response waveform of a voltage across the gate and source of an N-channel MOSFET of the gate drive circuit according to Embodiment 1 of the present invention.

FIG. 5 shows a transient response waveform of Vgs of the N-channel MOSFET 3 when the N-channel MOSFET 3 of the gate drive circuit 1 is turned off. In FIG. 5, the vertical axis is Vgs, which represents a potential difference applied across the gate and source of the N-channel MOSFET 3. The dashed line in the figure shows a case (case 2) in which the second DC voltage supply 12 is not provided, which is the same as the transient response waveform shown in FIG. 3. Moreover, the solid line in the figure shows a case (case 1) in which the second DC voltage supply 12 is provided. The source potential stays at a fixed potential (+Vnbuffer), regardless of the on/off operation of the N-channel MOSFET 3. The gate potential is set higher by Vout with respect to the source potential in the on operation of the MOSFET 3; however in the off operation, it becomes lower by Vnbuffer with respect to the source potential. Therefore, Vgs varies from +Vout to −Vnbuffer when the N-channel MOSFET 3 begins turning off. That is, it varies more by Vnbuffer than the case in which the second DC voltage supply 12 is not provided. As described above, the provision of the second DC voltage supply enables Vgs to vary over a potential difference of Vout+Vnbuffer; however the maximum voltage actually applied across the gate and source of the N-channel MOSFET 3 is Vout, which is the same as that in the case in which the second DC voltage supply 12 is not provided. That is to say, the specification of the Vgs withstanding voltage in the on operation of the N-channel MOSFET 3 does not need to be changed.

As shown in FIG. 5, since a time constant for Vgs variation after turning off does not change depending on the presence/absence of the second DC voltage supply 12, the greater Vgs voltage variation is, the higher the voltage variation rate can be raised. Therefore, if the second DC voltage supply 12 is provided and the source voltage is raised by Vnbuffer, Vgs of the N-channel MOSFET 3 reaches Vth more quickly compared to the case in which the second DC voltage supply 12 is not provided, so that the time until Vgs reaches Vth can be shortened by Δtoff. Furthermore, the voltage variation rate of Vgs when reaching Vth can be also raised higher compared to the case in which the second DC voltage supply 12 is not provided, so that toff can be shortened. As described above, since the gate potential in the turn-off operation can be varied more by Vnbuffer without changing the Vgs value of the N-channel MOSFET 3 when it is on, the N-channel MOSFET 3 can be turned off at high speed. Therefore, the time until the P-channel MOSFET 2 is turned on is shortened, so that the MOSFET 10 can be turned on at high speed.

In addition, the source of the N-channel MOSFET 3 is not negatively biased in this Embodiment; however, Vth of the MOSFET 10 subject to drive differs depending on its application and type, and also the level of noise imposed on the MOSFET 10 greatly differs depending on the environment of usage. Therefore, when Vth of the MOSFET 10 has an enough margin against noise or noise is small enough, Vgs does not need to be proactively approximated to zero (V) or to be negatively biased.

As described above, by configuring the positive electrode of the second DC voltage supply 12 to be connected to the source of the N-channel MOSFET 3, the N-channel MOSFET 3 can be turned off at high speed, so that the gate drive circuit 1 can drive the MOSFET 10 at high speed.

Embodiment 2

Figure 6:
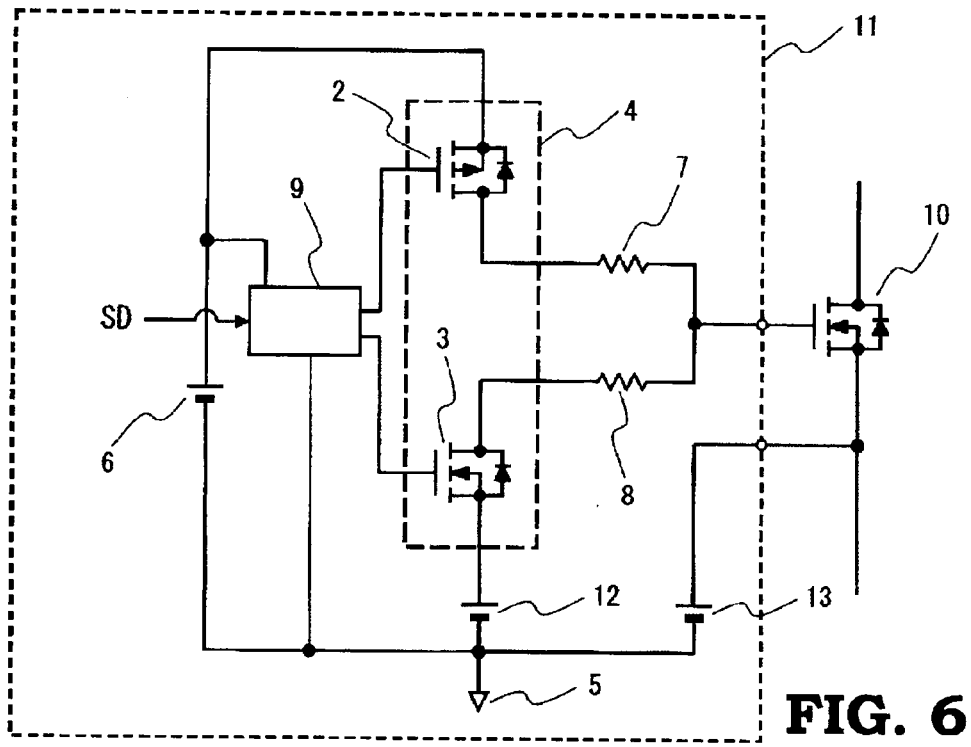
FIG. 6 is a schematic configurational diagram of a gate drive circuit according to Embodiment 2 of the present invention.

FIG. 6 is a schematic configurational diagram of a gate drive circuit according to Embodiment 2 of the present invention. In FIG. 6, parts with the same reference numerals are the same as or corresponding to those in FIG. 1; this commonly applies throughout the description. The gate drive circuit 11 according to this Embodiment differs from Embodiment 1 in that a third DC voltage supply 13 is provided the positive electrode of which is connected to the source of the MOSFET 10 and the negative electrode of which is connected to the reference potential 5.

When a voltage supplied by the third DC voltage supply 13 is Voffset, the third DC voltage supply 13 can raise the source potential of the MOSFET 10 by Voffset with respect to the reference potential 5, and Vgs of the MOSFET 10 can be made adjustable. For example, by adjusting Vgs of the MOSFET 10 in such a relation that Vnbuffer<Voffset, Vgs of the MOSFET 10 when it is off can be negatively biased. Negative biasing can prevent the MOSFET 10 from malfunctioning due to noise.

As described above, the positive electrode of the second DC voltage supply 12 is connected to the source of the N-channel MOSFET 3, and the positive electrode of the third DC voltage supply 13 is connected to the source of the MOSFET 10, whereby the gate drive circuit 11 can compatibly fulfill both functions of turning off the N-channel MOSFET 3 at high speed so as to drive the MOSFET 10 at high speed and preventing the MOSFET 10 from malfunctioning due to noise. It goes without saying that the relation between Vnbuffer and Voffset can be arbitrarily set taking into consideration noise tolerance and the like, without limiting to the relation that Vnbuffer<Voffset.

Embodiment 3

Figure 7:
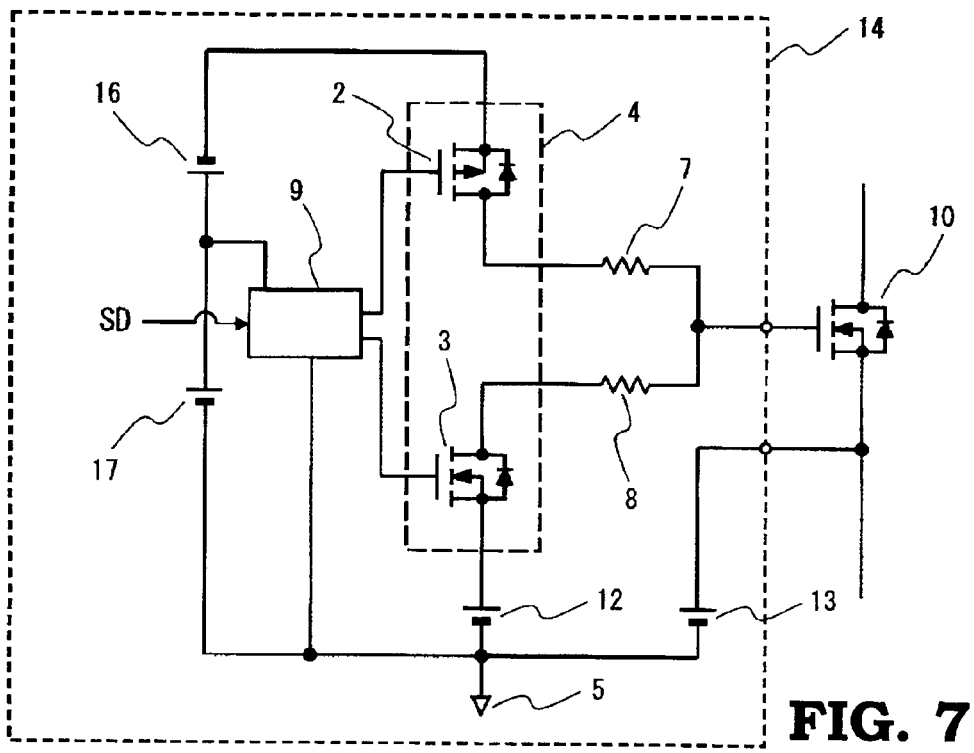
FIG. 7 is a schematic configurational diagram of a gate drive circuit according to Embodiment 3 of the present invention.

FIG. 7 is a schematic configurational diagram of a gate drive circuit according to Embodiment 3 of the present invention. The gate drive circuit 14 according to this Embodiment differs from Embodiment 2 in that a fourth DC voltage supply 16 is interposed between the P-channel MOSFET 2 and the first DC voltage supply 17, and the positive electrode of which is connected to the positive electrode of the first DC voltage supply 17 and the negative electrode of which is connected to the source of the P-channel MOSFET 2. The gate drive circuits according to Embodiment 1 and Embodiment 2 aim at increasing turn-on speed of the MOSFET 10. If turn-off speed of the MOSFET 10 can be increased, it can further bring about merits such as reduction in switching loss in the MOSFET 10. The gate drive circuit according to this Embodiment, in order to quickly turn off the MOSFET 10, aims at increasing turn-off speed of the P-channel MOSFET 2 of the buffer 4.

In FIG. 7, the negative electrode of the first DC voltage supply 17 is connected to the reference potential 5, and the positive electrodes of the fourth DC voltage supply 16 and the first DC voltage supply 17 are connected with each other. A DC voltage produced by the fourth DC voltage supply 16 (hereinafter denoted by Vpbuffer) is set lower than a DC voltage of Vout produced by the first DC voltage supply 17. In the gate drive circuit 14 configured as above, the voltage of Vpbuffer applied by the fourth DC voltage supply 16 can lower the source potential of the P-channel MOSFET 2 by Vpbuffer with respect to the potential at the connecting point of the first DC voltage supply 17 with the fourth DC voltage supply 16. Since the source potential of the P-channel MOSFET 2 is lowered by Vpbuffer, the voltage of the first DC voltage supply 17 is set relatively higher by Vpbuffer. The high potential side of the gate voltage output from the drive logic 9 is also set relatively higher by Vpbuffer, and a gate voltage of Vout+Vpbuffer is output. Since the voltage of the first DC voltage supply 17 is set relatively higher by Vpbuffer, even if the source potential is lowered by Vpbuffer by the fourth DC voltage supply 16, Vgs of the P-channel MOSFET 2 in the on operation is set to the same value. Vout and Vpbuffer can be arbitrarily set in conformity with the specification of the P-channel MOSFET 2. Here, since the operations of the second DC voltage supply 12 and the third DC voltage supply 13 are the same as that of Embodiment 2, their explanation will be omitted.

Figure 8:
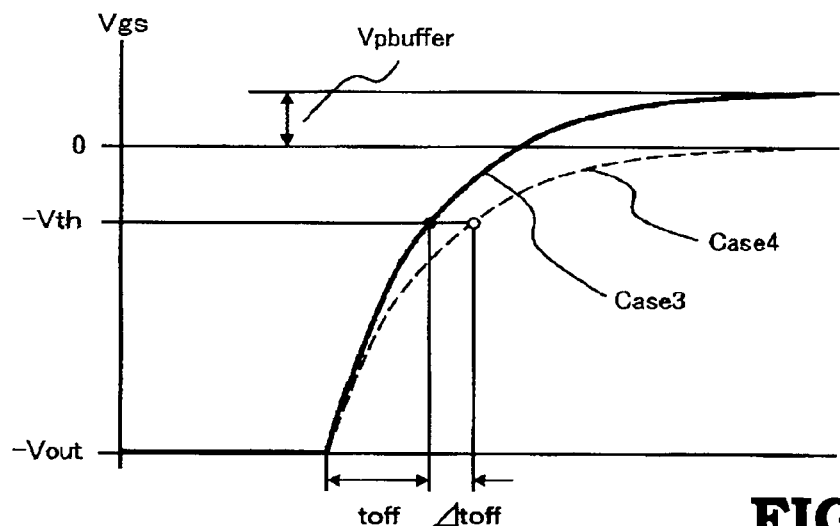
FIG. 8 is a diagram showing a transient response waveform of a voltage across the gate and source of a P-channel MOSFET of the gate drive circuit according to Embodiment 3 of the present invention.

FIG. 8 shows a transient response waveform of Vgs when the P-channel MOSFET 2 of the gate drive circuit 14 is turned off. In FIG. 8, the vertical axis is Vgs, which represents a potential difference applied across the gate and source of the P-channel MOSFET 2. The dashed line in the figure shows a case (case 4) in which the fourth DC voltage supply 16 is not provided, which is the same as the transient response waveform shown in FIG. 3. Moreover, the solid line in the figure shows a case (case 3) in which the fourth DC voltage supply 16 is provided. The source potential stays at a fixed potential regardless of the on/off operation of the P-channel MOSFET 2. In this Embodiment, the gate potential is set lower by Vout with respect to the source potential when the P-channel MOSFET 2 is in the on operation; however when in the off operation, it becomes higher by Vpbuffer with respect to the source potential. Therefore, when the P-channel MOSFET 2 begins turning off, Vgs varies from −Vout to +Vpbuffer. That is, it varies more by Vpbuffer compared to the case in which the fourth DC voltage supply 16 is not provided. As described above, the provision of the fourth DC voltage supply 16 enables Vgs to vary over a potential difference of Vout+Vpbuffer; however the maximum voltage actually applied across the gate and source of the P-channel MOSFET 2 is Vout, which is the same as that in the case in which the fourth DC voltage supply 16 is not provided. That is to say, the specification of the Vgs withstanding voltage when the P-channel MOSFET 2 is in the on operation does not need to be changed.

As shown in FIG. 8, since a time constant for Vgs variation after turning off does not change depending on the presence/absence of the fourth DC voltage supply 16, the greater the Vgs voltage variation is, the higher the voltage variation rate can be raised. Therefore, if the fourth DC voltage supply 16 is provided, so as to raise the source voltage by Vpbuffer, Vgs of the P-channel MOSFET 2 reaches Vth more quickly compared to the case in which the fourth DC voltage supply 16 is not provided, so that the time until Vgs reaches Vth can be shortened by Δtoff. Moreover, the voltage variation rate of Vgs when reaching Vth can also be raised higher compared to the case in which the fourth DC voltage supply 16 is not provided, and toff can be shortened. As described above, since the gate potential in the turn-off operation can be varied more by Vpbuffer without changing the Vgs value of the P-channel MOSFET 2 when it is on, the P-channel MOSFET 2 can be turned off at high speed. Therefore, the time until the N-channel MOSFET 3 is turned on is shortened, so that the MOSFET 10 can be turned off at high speed.

Figure 9:
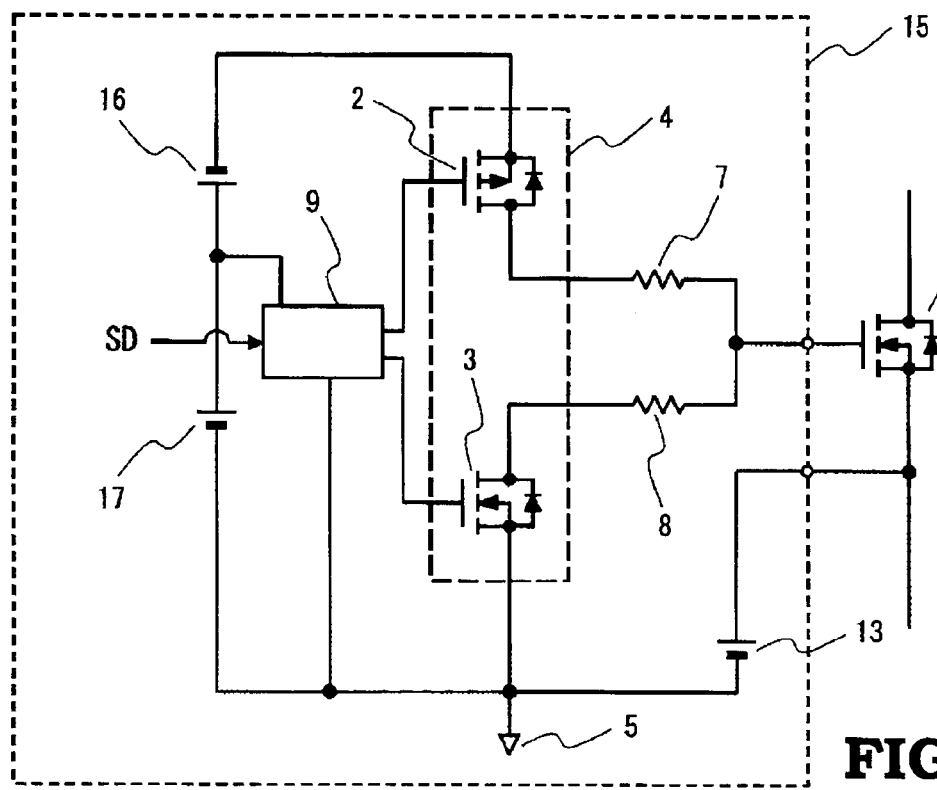
FIG. 9 is a schematic configurational diagram of another gate drive circuit according to Embodiment 3 of the present invention.

Moreover, as explained in Embodiments 1 and 2, the source potential of the N-channel MOSFET 3 is raised higher than the reference potential 5 by the second DC voltage supply 12, whereby the time until the N-channel MOSFET 3 turns off can be shortened. Furthermore, as explained in Embodiment 2, Vgs of the MOSFET 10 subject to drive can be adjusted by the third DC voltage supply 13, whereby the MOSFET 10 can be prevented from malfunctioning. In addition, as with Embodiment 1, when Vth of the MOSFET 10 has an enough margin against noise or noise is small enough, Vgs does not need to be negatively biased by providing the third DC voltage supply 13. Moreover, when it is aimed only to turn off the MOSFET 10 at high speed, the gate drive circuit may be configured without providing the second DC voltage supply 12 as with the gate drive circuit 15 shown in FIG. 9.

As explained above, by configuring in such a way that the negative electrode of the fourth DC voltage supply 16 is connected to the source of the P-channel MOSFET 2 and the positive electrode of the second DC voltage supply 12 is connected to the source of the N-channel MOSFET 3, the P-channel MOSFET 2 and the N-channel MOSFET 3 each can be turned off at high speed, so that the gate drive circuit 14 can drive the MOSFET at high speed. Moreover, connecting the positive electrode of the third DC voltage supply 13 to the source of the MOSFET 10 subject to drive enables the MOSFET 10 to be prevented from malfunctioning due to noise.

Embodiment 4

Figure 10:
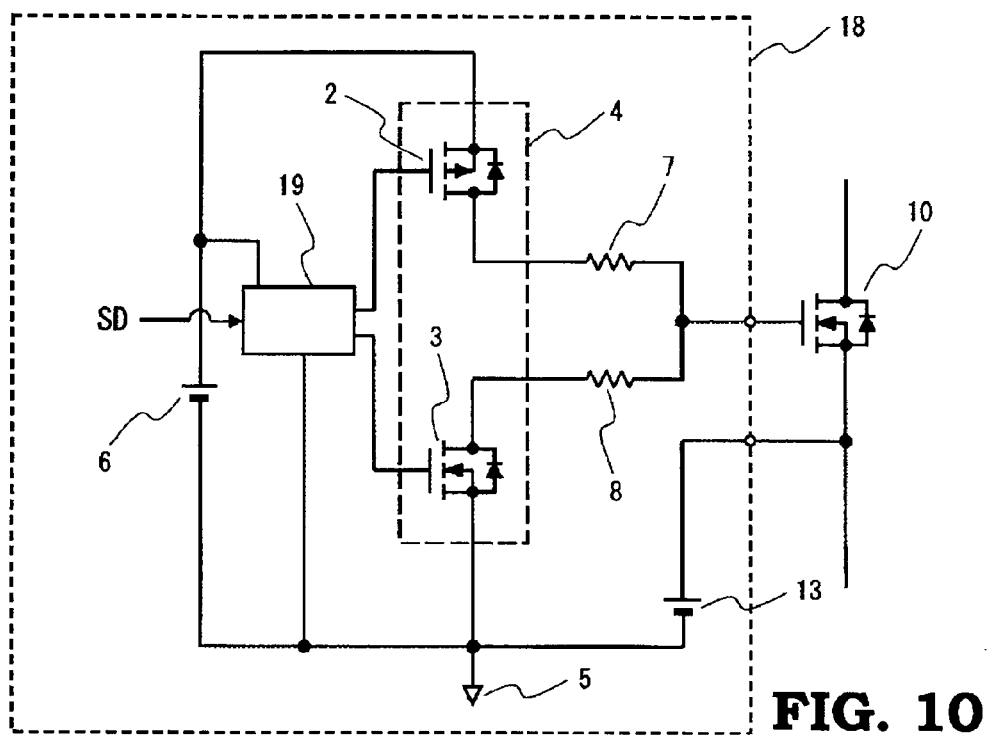
FIG. 10 is a schematic configurational diagram of a gate drive circuit according to Embodiment 4 of the present invention.

In order to enhance switching speed of the buffer, in Embodiment 1 to Embodiment 3 has been employed a method of offsetting the source potential of MOSFETs inside the buffer by DC voltage supplies and widely varying the gate potential thereof without changing the Vgs value in the on operation. As the method of widely varying the gate potential without changing the Vgs value in the on operation, there is known a method of adjusting the gate voltage output from the drive logic to the buffer, which enables a similar function to be performed. FIG. 10 is a schematic configurational diagram of a gate drive circuit according to Embodiment 4 of the present invention. The gate drive circuit 18 according to this Embodiment differs from Embodiment 2 in that the DC voltage supply the positive electrode of which is connected to the source of the P-channel MOSFET is not provided, and a drive logic 19 is provided in place of the drive logic 9.

In FIG. 10, the gate voltage output from the drive logic 19 is designed so as to speed up switching of the buffer 4. Here, the source potential of the P-channel MOSFET 2 becomes the same as the output voltage from the first DC voltage supply 6 (hereinafter denoted by Vdc).

Moreover, the source potential of the N-channel MOSFET 3 becomes the same as the reference potential 5.

Figure 11:
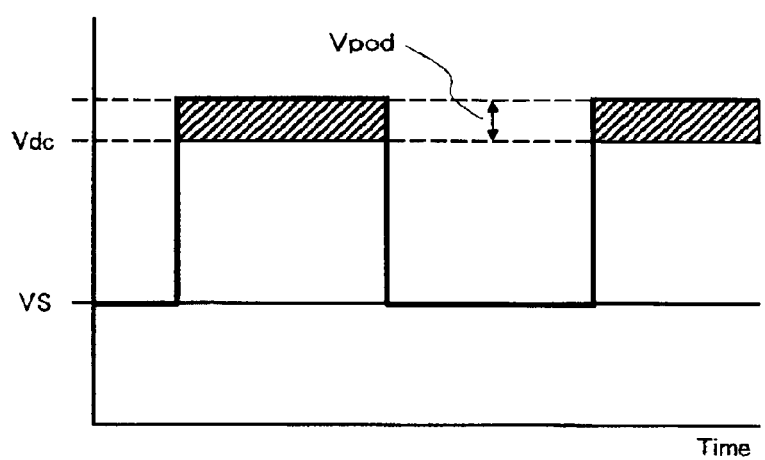
FIG. 11 is a diagram showing a first example of a gate-voltage output waveform output from a drive logic according to Embodiment 4 of the present invention.

A first example of a waveform of the gate voltage output from the drive logic 19 is shown in FIG. 11. As shown in FIG. 11, the gate voltage output from the drive logic 19 is a voltage pulse, the high potential side of which is controlled to become higher by an offset voltage (hereinafter denoted by Vpod) with respect to Vdc that is the source potential of the P-channel MOSFET 2. The source potential of the P-channel MOSFET 2 is fixed at Vdc, and the gate potential thereof repeatedly varies from Vdc+Vpod to the reference potential 5, whereby operation of turning on/off the P-channel MOSFET 2 is performed. That is, Vgs in the turn-off operation can be varied in a range from the reference potential to Vdc+Vpod, without raising Vgs in the turn-on operation of the P-channel MOSFET 2 higher than Vdc. Therefore as explained in Embodiment 3, the P-channel MOSFET 2 can be turned off at high speed, and the time until the N-channel MOSFET 3 is turned on becomes short, so that the MOSFET 10 can be turned off at high speed.

Figure 12:
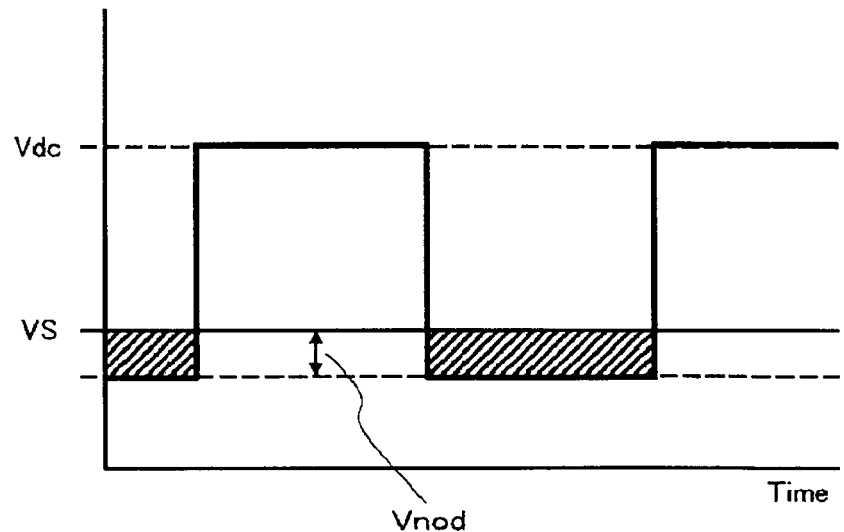
FIG. 12 is a diagram showing a second example of the gate-voltage output waveform output from the drive logic of Embodiment 4 of the present invention.

Moreover, a second example of a waveform of the gate voltage output from the drive logic 19 is shown in FIG. 12. As shown in FIG. 12, the gate voltage output from the drive logic 19 is a voltage pulse, the low potential side of which is controlled to become lower by an offset voltage (hereinafter denoted by Vnod) with respect to the reference potential 5 that is the source potential of the N-channel MOSFET 3. The source potential of the N-channel MOSFET 3 is fixed at the reference potential 5, and the gate potential thereof repeatedly varies from □Vnod to Vdc, whereby operation of turning on/off the N-channel MOSFET 3 is performed. That is, without raising Vgs higher than Vdc in the on operation of the N-channel MOSFET 3, Vgs when it is turned off can be varied in a range of Vdc+Vnod. Therefore as explained in Embodiment 1, the N-channel MOSFET 3 can be turned off at high speed, and the time until the P-channel MOSFET 2 is turned on becomes short, so that the MOSFET 10 can be turned on at high speed.

Figure 13:
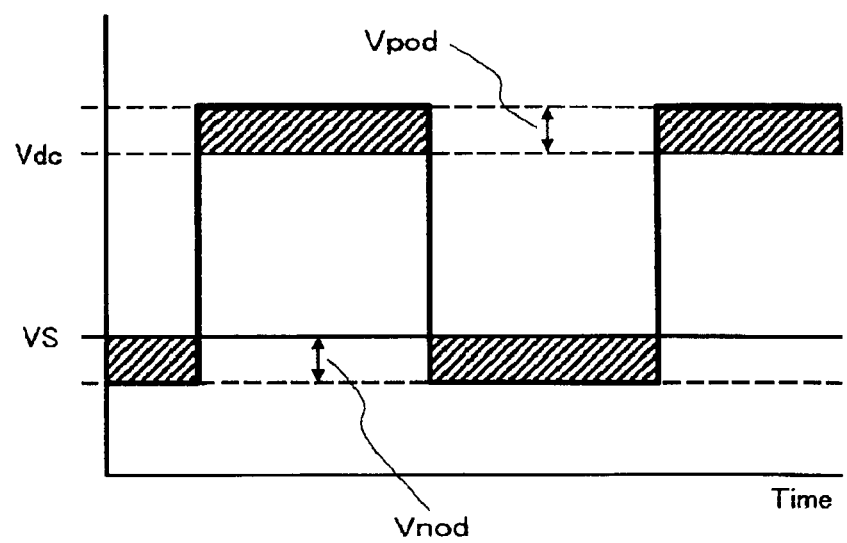
FIG. 13 is a diagram showing a third example of the gate-voltage output waveform output from the drive logic of Embodiment 4 of the present invention.

Furthermore, a third example of a waveform of the gate voltage output from the drive logic 19 is shown in FIG. 13. FIG. 13 shows a combination of the output waveforms shown in FIG. 11 and FIG. 12. In FIG. 13, the high potential side of the gate voltage output from the drive logic 19 is set higher by Vpod with respect to Vdc, and the low potential side thereof is set lower by Vnod with respect to the reference potential 5. By the drive logic 19 outputting the forgoing gate voltage, the N-channel MOSFET 3 is turned off at high speed, so that the MOSFET 10 can be turned on at high speed, as well as the P-channel MOSFET 2 is turned off at high speed, so that the MOSFET 10 can be turned off at high speed.

As described above, by adjusting the gate voltage from the drive logic 19, the gate drive circuit 18 can drive the MOSFET 10 at high speed. In addition, it may be configured excluding the third DC voltage supply 13, taking into consideration its noise tolerance and the like. Moreover, the configuration of the drive logic 19 of this Embodiment may be applied to the conventional gate drive circuit shown in FIG. 2, or can be additionally applied to the gate drive circuits shown in Embodiment 1 to Embodiment 3.

Moreover in Embodiment 1 to Embodiment 4, explanations have been made on examples in which each gate drive circuit is applied to a MOSFET as the semiconductor switching element; however, the present invention is not limited to this, but can be applied to other switching elements such as transistors. Moreover, the semiconductor switching element also is not limited to the MOSFET, but the invention can be applied to a bipolar transistor such as an IGBT (insulated-gate bipolar transistor). Furthermore, it can be applied to a JFET (junction field-effect transistor). In addition, when a bipolar transistor is used, the source of the MOSFET corresponds to the emitter thereof.

Moreover, switching elements, in all of the embodiments, may be made of wide-bandgap semiconductor the bandgap of which is wider than that of silicon. The wide-bandgap semiconductor includes silicon-carbide- or gallium-nitride-based material or diamond. Switching elements made of the wide-bandgap semiconductor have high breakdown voltage characteristics and also high allowable current density; therefore the switching elements can be decreased in size, and by using those downsized switching elements, semiconductor modules incorporating those elements can be downsized. Moreover, since they also have high heat resistance, radiation fins for their heat sink can be decreased in size, and a water-cooling system therefore can be replaced with an air-cooling one; which therefore enables further reduction in size of the semiconductor modules. Furthermore, the switching elements can be made highly efficient because of their low power loss; therefore the semiconductor modules can be eventually made highly efficient.

DESCRIPTION OF THE REFERENCE NUMERALS 1, 11, 14, 15, 18, 21: gate drive circuit
2: P-channel MOSFET
3: N-channel MOSFET
4: buffer
5: reference potential
6, 12, 13, 16, 17, 22: DC voltage supply
7: gate resistor for on state
8: gate resistor for off state
9, 19: drive logic
10: MOSFET

The invention claimed is:

1. A gate drive circuit for driving a semiconductor switching element, the gate drive circuit comprising:
   a buffer circuit including a turn-on-drive switching element and a turn-off-drive switching element that are complementarily turned on and off, for driving the semiconductor switching element;
   a first DC voltage supply including a positive electrode connected to a source or emitter of the turn-on-drive switching element and a negative electrode connected to a reference potential of the gate drive circuit; and
   a second DC voltage supply including a positive electrode connected to the source or emitter of the turn-off-drive switching element and a negative electrode connected to the reference potential.

2. A gate drive circuit according to claim 1, further comprising a third DC voltage supply including a positive electrode connected to the source of the semiconductor switching element and a negative electrode connected to the reference potential; wherein
   a DC voltage produced by the second DC voltage supply is lower than a DC voltage produced by the third DC voltage supply.

3. A gate drive circuit according to claim 2, further comprising a fourth DC voltage supply interposed between the turn-on-drive switching element and the first DC voltage supply; wherein
   a positive electrode of the fourth DC voltage supply is connected to the positive electrode of the first DC voltage supply, a negative electrode of the fourth DC voltage supply is connected to a source or emitter of the turn-on-drive switching element, and a DC voltage produced by a fourth DC voltage supply is lower than a DC voltage produced by the first DC voltage supply.

4. A gate drive circuit according to claim 1, further comprising a third DC voltage supply interposed between the turn-on-drive switching element and the first DC voltage supply; wherein
   a positive electrode of the fourth DC voltage supply is connected to the positive electrode of the first DC voltage supply, a negative electrode of the fourth DC voltage supply is connected to a source or emitter of the turn-on-drive switching element, and a DC voltage produced by the third DC voltage supply is lower than a DC voltage produced by the first DC voltage supply.

5. A gate drive circuit according to claim 1, wherein the semiconductor switching element is made of wide-bandgap semiconductor.

6. A gate drive circuit according to claim 5, wherein the wide-bandgap semiconductor includes silicon-carbide-based or gallium-nitride-based material or diamond.

7. A gate drive circuit for driving a semiconductor switching element, the gate drive circuit comprising:
a buffer circuit including a turn-on-drive switching element and a turn-off-drive switching element that are complementarily turned on and off, for driving the semiconductor switching element;
a first DC voltage supply including a negative electrode connected to a reference potential of the gate drive circuit; and
a second DC voltage supply interposed between the turn-on-drive switching element and the first DC voltage supply; wherein
a positive electrode of the second DC voltage supply is connected to a positive electrode of the first DC voltage supply, a negative electrode of the second DC voltage supply is connected to a source or emitter of the turn-on-drive switching element, and a DC voltage produced by the second DC voltage supply is lower than a DC voltage produced by the first DC voltage supply.

8. A gate drive circuit according to claim 7, wherein the semiconductor switching element is made of wide-bandgap semiconductor.

9. A gate drive circuit according to claim 8, wherein the wide-bandgap semiconductor includes silicon-carbide-based or gallium-nitride-based material or diamond.

10. A gate drive circuit for driving a semiconductor switching element, the gate drive circuit comprising:
a buffer circuit including a turn-on-drive switching element and a turn-off-drive switching element that are complementarily turned on and off, for driving the semiconductor switching element;
a DC voltage supply including a positive electrode connected to a source or emitter of the turn-on-drive switching element and a negative electrode connected to a reference potential of the gate drive circuit; and
a drive logic for outputting a voltage pulse to the gate of the turn-on-drive switching element and the gate of the turn-off-drive switching element; wherein
the drive logic takes at least either one of controls of outputting the voltage pulse with a high potential side which is raised higher than a source potential of the turn-on-drive switching element and outputting the voltage pulse with a low potential side which is lowered lower than a source potential of the turn-off-drive switching element.

11. A gate drive circuit according to claim 10, wherein the semiconductor switching element is made of wide-bandgap semiconductor.

12. A gate drive circuit according to claim 11, wherein the wide-bandgap semiconductor includes silicon-carbide-based or gallium-nitride-based material or diamond.

* * * * *